United States Patent [19]

Cohen

[11] 4,049,982
[45] Sept. 20, 1977

[54] ELLIPTICAL, INTERDIGITAL TRANSDUCER

[75] Inventor: Paul B. Cohen, East Syracuse, N.Y.

[73] Assignee: The United States of America as represented by the Secretary of the Air Force, Washington, D.C.

[21] Appl. No.: 715,759

[22] Filed: Aug. 18, 1976

[51] Int. Cl.² .................................. H01L 41/04
[52] U.S. Cl. ........................................ 310/366
[58] Field of Search ............ 310/9.8, 8.1; 333/30 R, 333/72

[56] References Cited

U.S. PATENT DOCUMENTS 3,727,718  4/1973  Whitehouse ............... 333/30 R
3,919,669  11/1975  Hartemann ............... 310/9.8 X Primary Examiner—Mark O. Budd
Attorney, Agent, or Firm—Joseph E. Rusz; Jacob N. Erlich

[57] ABSTRACT

An elliptical, interdigital transducer having a plurality of concentric elliptically shaped conductive fingers situated in one quadrant of an ellipse and mounted on a piezoelectric material. Upon the application of an excitation frequency to said transducer a low frequency surface wave will propagate along the major axis of the ellipse and a high frequency surface wave will propagate along the minor axis of the ellipse. Resonance will occur at a predetermined point on a line through the elliptically-shaped fingers and the focus of the ellipse.

7 Claims, 1 Drawing Figure

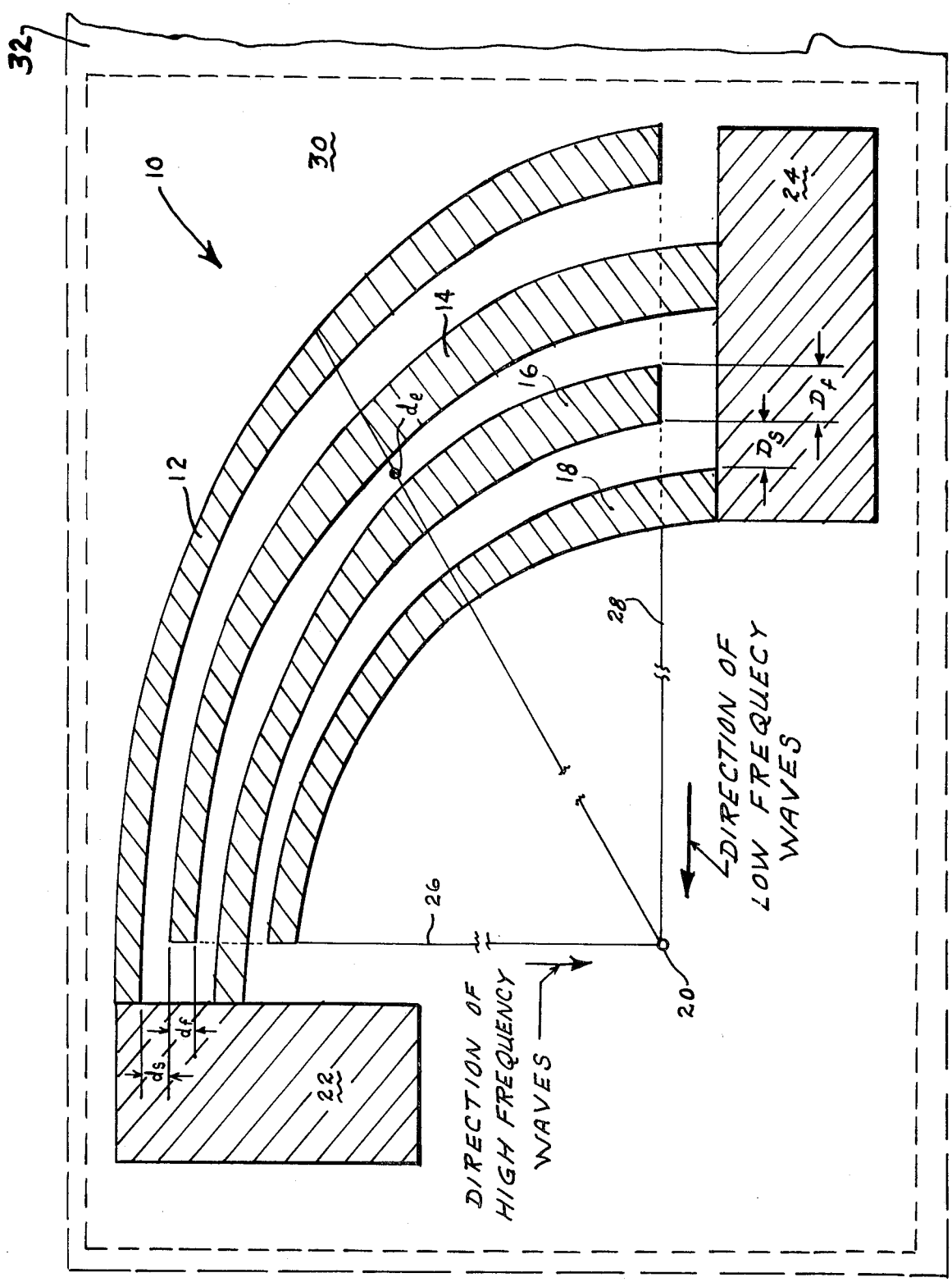

ELLIPTICAL, INTERDIGITAL TRANSDUCER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to transducers, and, more particularly, to an elliptical, interdigital transducer which will create an acoustic wave in a piezoelectric medium.

A transducer is any device or element which converts an input signal into an output signal of a different form. An example would be a microphone which converts vibrations caused by an impinging sound wave into an electrical signal.

The most widely used class of transducers is the electromechanical transducer which converts an electrical signal into a mechanical signal (a vibration or a displacement) or vice versa. This class includes phonograph pickups, loudspeakers, horns, doorbells and underwater transducers.

In the simplest of surface wave transducers, a piezoelectric film is deposited on a substrate, and two metal contacts are deposited on the piezoelectric coating. When the metal contacts are excited with an A.C. voltage, the contacts are alternately "pulled together" and "pushed apart" by the electric field. This pushing and pulling in the piezoelectric medium is transmitted to the substrate, and travels along the surface of the substrate.

In an interdigital transducer, more contacts are added, physically and connected electrically in parallel. The increased number of "fingers" will, if properly spaced, increase the amplitude of the surface wave due to constructive interference.

SUMMARY OF THE INVENTION

The instant invention sets forth an ellipitical interdigital transducer which creates an acoustic wave in a piezoelectric medium and wherein the direction of propagation is dependent on the frequency of the applied excitation voltage.

The elliptical transducer of this invention is made up of a series of concentric ellipses, connected interdigitally and deposited upon on a piezoelectric material. When an A.C. signal of frequency $f_1$ is applied to the transducer, resonance will occur at the major axis, and a surface wave of frequency $f_1$ will propagate toward the focus via the major axis. If frequency $f_1$ is now increased to $f_2$, the new surface wave of frequency $f_2$ will propagate toward the focus via the minor axis. For any exitation frequency $f$, such that $f_1 \leq f \leq f_2$, resonance will occur on some line from the focus through the ellipse, intersecting the ellipse at some point between the major and minor axis, and a surface wave of frequency $f$ will propagate along that line from the ellipse to the focus. The direction of propagation is dependent on the frequency of the applied exitation voltage.

It is therefore an object of this invention to provide an elliptical, interdigital transducer.

It is another object of this invention to provide an elliptical, interdigital transducer in which the direction of propagation is dependent on the frequency of the applied excitation voltage.

It is still a further object of this invention to provide an elliptical, interdigital transducer which is economical to produce and which utilizes conventional, currently available components that lend themselves to standard mass producing manufacturing techniques.

For a better understanding of the present invention together with other and further objects thereof reference is made to the following description taken in conjunction with the accompanying drawing and its scope will be pointed out in the appended claims.

DESCRIPTION OF THE DRAWING

The only FIGURE of the drawing is a schematic representation of the elliptical, interdigital transducer of this invention.

DETAILED DESCRIPTION OF THE PREFERRED EMBODIMENT

Reference is now made to the only FIGURE of the drawing which schematically illustrates the transducer 10 of this invention. Transducer 10 is made of any suitable conductive material such as copper or aluminum. The configuration of transducer 10 is an essential aspect of the instant invention, being in the form of a plurality of concentric elliptical fingers 12, 14, 16 and 18 located in one quadrant of an ellipse and having their focus at 20. Fingers 12, 14, 16 and 18 are connected interdigitally with fingers 12 and 16 connected to a contact surface 22 and fingers 14 and 18 connected to a contact surface 24. Along the minor axis 26 of the ellipse, the spacing between the interdigital fingers 12, 14, 16 and 18, respectively is a distance $d_s$ while the finger width is $d_f$. Along the major axis 28 of the ellipse, the interdigital spacing is $D_s$ and the width of fingers 12, 14, 16 and 18 is $D_f$. Although four fingers are shown in the drawing, optimum results can be obtained with 4 or 6 fingers interdigitally spaced. In addition, it is preferable that distance $d_s = d_f \leq 1$mm while the distance $D_s = D_f \leq 2d$.

In construction, any suitable piezoelectric thin film 30, such as cadmium sulfide or zinc oxide, is evaporated in any conventional manner on a substrate 32 made of any suitable material such as glass or quartz. Fingers 12, 14, 16, 18 and contacts 22 and 24 of transducer 10 made of any suitable material such as copper or aluminum is then evaporated on piezoelectric surface 30. Any suitable A.C. source (not shown) is electrically connected to contacts 22 and 24.

The characteristics of the elliptical, interdigital transducer 10 of this invention are set forth as follows:

The frequency, $f$, of the propagated surface wave is:

$$f = V/\lambda \quad (1)$$

where $V$ is the characteristic velocity of acoustic waves in the piezoelectric medium.

The wavelength, $\lambda$, is determined by the dimensions of transducer 10:

$$\lambda = 2[D_s + D_f] \quad (2)$$

when $$\lambda = 4D \quad (3)$$

However, the dimensions $D_s$ and $D_f$ vary between the major axis ($D_s$ and $D_f$) and the minor axis ($d_s$ and $d_f$). The resonant frequency, therefore, varies from $$\text{(Major axis)} f_1 = V/4D \quad (4a)$$

$$\text{(Minor axis)} f_2 = V/4d \quad (4b)$$

When an A.C. signal of frequency $f$ is applied to device 10, resonance will occur, and a surface wave will propagate toward the focus 20 of the ellipse.

Along the major axis 28 a low frequency surface $f_1$ will propagate toward (and away from) the focus 20 when the exitation frequency is $f_1$. Along the minor axis 26 a high frequency surface wave $f_2$ will propagate toward (and away from) the focus 20 when the exitation is $f_2$.

For any excitation $f$, such that $f_1 \leq f \leq f_2$ resonance will occur at some point, $d_e$, in the ellipse where
$$d_e = V/4f$$

The wave will always propagate on a line 34 through the ellipse at $d_e$ and focus 20. The point through which resonance occurs, $d_e$, will sweep from the major to the minor axis as applied frequency $f$ is swept from $f_1$ to $f_2$, with instantaneous frequency $f$. The amplitude of the surface wave is a function of the number of fingers, as well as the applied voltage. The more fingers 12, 14, 16 and 18 the stronger the wave, however, more fingers also produce a more collimated propagated wave. As a result thereof 4 or 6 fingers may be considered to produce optimum results.

Although this invention has been described with reference to a particular embodiment it will be understood to those skilled in the art that this invention is also capable of a variety of alternate embodiments within the spirit and scope of the appended claims.

I claim:

1. An elliptical, interdigital transducer comprising a plurality of concentric, elliptically shaped conductive fingers situated within one quadrant of an ellipse and mounted on a piezoelectric material, said fingers having a width and a spacing along the minor axis of said ellipse substantially equal to each other, said fingers having a width and a spacing along the major axis of said ellipse substantially equal to each other, and said width and spacing of said fingers, respectively, along said major axis being substantially twice the width and spacing of said fingers, respectively, along said minor axis, whereby upon the application of an exitation frequency $f_1$ to said transducer, a low frequency surface wave of frequency $f_1$ will propagate along the major axis toward the focus, and upon application of an exitation of frequency $f_2$, with $f_2 > f_1$, a high frequency surface wave of frequency $f_2$ will propagate along the minor axis toward the focus, and upon application of exitation frequency $f$ with $f_1 \leq f \leq f_2$, a resonance will occur at some point, $d_e$, on a line through the ellipse and the focus such that $d_e = V/4f$, where $V$ is the characteristic velocity of acoustic waves in said piezoelectric material.

2. An elliptical, interdigital transducer as defined in claim 1 further comprising a first contact surface electrically connected to one set of alternate fingers substantially along said major axis and a second contact surface electrically connected to another set of alternate fingers substantially along said minor axis.

3. An elliptical, interdigital transducer as defined in claim 2 wherein said width and spacing of said fingers along said minor axis is approximately a millimeter each.

4. An elliptical, interdigital transducer as defined in claim 3 wherein said fingers are made of copper.

5. An elliptical, interdigital transducer as defined in claim 3 wherein said fingers are made of aluminum.

6. An elliptical, interdigital transducer as defined in claim 3 wherein there are four conductive fingers.

7. An elliptical, interdigital transducer as defined in claim 3 wherein there are six conductive fingers.

* * * * *

UNITED STATES PATENT OFFICE
CERTIFICATE OF CORRECTION

PATENT NO. : 4,049,982
DATED : September 20, 1977
INVENTOR(S) : Paul B. Cohen

It is certified that error appears in the above-identified patent and that said Letters Patent are hereby corrected as shown below:

Column 2, line 59, the expression ---$D_s = D_f = D$,--- should be inserted after "when".

Signed and Sealed this

Twenty-first Day of February 1978

[SEAL]

Attest:

RUTH C. MASON
Attesting Officer

LUTRELLE F. PARKER
Acting Commissioner of Patents and Trademarks